United States Patent [19]

Ehrlich et al.

[11] Patent Number: 4,834,834
[45] Date of Patent: May 30, 1989

[54] LASER PHOTOCHEMICAL ETCHING USING SURFACE HALOGENATION

[75] Inventors: Daniel J. Ehrlich, Lexington; Mordecai Rothschild, Newton, both of Mass.

[73] Assignee: Massachusetts Institute of Technology, Cambridge, Mass.

[21] Appl. No.: 123,226

[22] Filed: Nov. 20, 1987

[51] Int. Cl.$^4$ ............... B44C 1/22; C23F 1/02; D05D 3/06; B23K 9/00
[52] U.S. Cl. ............... 156/635; 118/50.1; 118/620; 118/728; 156/643; 156/646; 156/651; 156/656; 156/659.1; 156/345; 219/121.69; 219/121.85; 204/192.35; 204/298; 427/38; 427/53.1
[58] Field of Search ............... 156/643, 646, 651, 656, 156/659.1, 667, 635, 345; 427/38, 53.1; 428/600, 601, 620, 628, 629, 660, 156, 170; 219/121 LH, 121 LJ, 121 FS, 121 LM, 121 LW, 121 PD, 121 PE, 121 PU, 121 PY; 204/192.35, 298; 118/50.1, 620, 728

[56] References Cited

U.S. PATENT DOCUMENTS

| 4,490,210 | 12/1984 | Chen et al. | 156/643 |
| 4,566,937 | 1/1986 | Pitts | 156/643 X |
| 4,615,904 | 10/1986 | Ehrlich et al. | 427/38 |
| 4,619,894 | 10/1986 | Bozler et al. | 430/942 |
| 4,622,095 | 11/1986 | Grobman et al. | 156/635 |

OTHER PUBLICATIONS

Rothschild et al., *Appl. Phys. Lett.* 49:1554–1556 (1986).

*Primary Examiner*—William A. Powell
*Attorney, Agent, or Firm*—Hamilton, Brook, Smith & Reynolds

[57] ABSTRACT

A method for maskless patterning and etching of metals is disclosed. The method comprises the steps of providing a metal, forming a passivating layer of an oxide or nitride upon the surface of the metal, exposing the metal to a halogenous atmosphere, while patterning the metal using a directed energy beam to selectively replace the oxides or nitrides with halides, and heating the patterned metal while exposing it to an etchant to etch regions located below the halogenated surfaces leaving the remaining passivated regons intact.

26 Claims, 10 Drawing Sheets

LASER PHOTOCHEMICAL ETCHING USING SURFACE HALOGENATION

The U.S. Government has rights in this invention pursuant to sponsorship of the research by the Department of the Air Force.

BACKGROUND OF THE INVENTION

Conventionally, the patterned etching of thin metallic films is accomplished by the use of photolithographic masks. For example, an etch-resistant coating ("a resist") is laid down upon a semiconductor wafer. A pattern is created by further coating portions of the resist with an opaque material and then irradiating the material to break down the exposed resist. The exposed resist is then removed by developing and the wafer may then be etched to produce a patterned film. This example illustrates positive resists, wherein the pattern which remains after development corresponds to the opaque regions. Negative resists are also known in the art.

The mask for the masking process normally comprises a layer of photosensitive resist material formed on the surface of a protective $SiO_2$ layer on a substrate. Typical photo-resist materials comprise organic materials which undergo chemical changes, such as molecular cross-linking, when subjected to UV radiation. The photo-resist layer is illuminated with ultraviolet light passed through a photo mask containing the desired pattern to be formed in the photo-resist layer. The photo-resist layer is developed to expose selected portions on the $SiO_2$ layer and the exposed portions are dissolved by acid solutions. Next, the remaining resist material i stripped away and a dopant is introduced to the semiconductor through the unprotected portions of the pattern.

The foregoing process is subject to a number of deficiencies, especially when attempting to use this process for submicrometer patterning of thin films where extremely high resolution is required. Some of the problems associated with such conventional masking systems are the following:

The organic photoresist materials are not inert to acids nor resistant to plasma treatments creating difficulties in maintaining the integrity of the mask pattern. Generally, the organic resist material will not survive temperatures above 200° C., which may occur in subsequent processing of the semiconductor wafer. Such resists also contain carbon and require organic solvents which may cause contamination unless extreme precaution is used.

Organic light sensitive resists must usually be formed in layer thicknesses of about 1 micron for satisfactory operation. The resolution of a mask is inversely proportional to mask thickness. The thinner the mask, the better the resolution. To achieve better resolution, thin X-ray sensitive masks of organic material have been utilized, but these masks require relatively long exposure time.

Organic resist materials are spun onto the surface, thus requiring the introduction of spinning equipment into the process with attendant problems of contamination.

The ability to etch thin films without using a mask would be an important processing capability for both the microelectronics and the photovoltaics industry. Elimination of the necessity of masking during thin film patterning would reduce the complexity and number of steps in, say, the etching step of Integrated Circuit (IC) chip formation. Further, it would make it more economical to produce custom or one-of-a-kind designs, since the expensive mask production step would be eliminated. One method for maskless etching is described in U.S. Pat. No. 4,619,894. In this method, an aluminum oxide layer on the substrate is patterned by selective heating. Conventional etching methods (such as acid bath immersion) are then used to expose the pattern.

Another method for producing patterned surfaces without using masks is described in U.S. Pat. No. 4,615,904. In this method, a thin absorption layer is formed upon a substrate surface, portions of the absorption layer are prenucleated using a focused energy beam, and deposition is induced with deposition occurring primarily upon prenucleated sections of the substrate. This method suffers from the inability to entirely prevent deposition upon non-prenucleated surfaces, resulting in deposition in areas where it is undesirable.

A third method of maskless etching (described in U.S. Pat. No. 4,622,095) involves exposing a metallized substrate to a beam of laser radiation in a halogen gas atmosphere to form a metal halide salt reaction product on the substrate. This metal halide salt is then removed from the substrate using a solvent for the metal halide salt.

In yet another method of maskless etching (described in U.S. Pat. No. 4,490,210) a metallized substrate is exposed to a selected gas which spontaneously reacts with the metal to form a solid reaction product with the metal by a partial consumption of the metal. A radiation beam of a wavelength suitable for absorption by the reaction product and/or the metal is applied in a desired pattern to vaporize the reaction product and selectively etch the metal.

The need still exists, however, for methods and apparatus for producing etched, patterned films without masks or liquid etchants and which does not adversely affect metal regions not subject to etching.

SUMMARY OF THE INVENTION

This invention pertains to a method for patterning and etching refractory metal films. More specifically, this invention pertains to a method for maskless etching of metal films on substrate surfaces using a two step process while contacting the metals with halogen containing atmospheres.

In one embodiment of the maskless method of the invention, surfaces of metal film coatings are patterned by first exposing the film to an atmosphere containing a passivating agent such as $O_2$ or $N_2$ to form a passivating layer upon the exposed surfaces of the film. Next, the passivated metal film is exposed to an atmosphere containing a halogen. A beam of optical energy is directed onto the metal film in the presence of the halogen to selectively form metal halides of the halogen in selected regions of the film, these regions being in the areas where the beam is directed. In such regions, the passivating agent is replaced by a halide. Finally, the patterned metal film is exposed to an atmosphere containing an etchant, such as $NF_3$ while the film is heated, thereby etching the patterned regions no longer protected by the passivating agent while leaving the passivated regions intact.

DETAILED DESCRIPTION OF THE INVENTION

Patterning and etching of metal thin films and substrates can be achieved using directed energy beams in halogenous atmospheres. The patterning process uses substrate surface modification to form regions which are susceptible to the subsequent etching step. More specifically, metal thin films and substrates may be patterned by irradiating them in halogenous atmospheres resulting in a photochemically activated halogen reaction with the refractory metal surface. This is followed by an etching step in which the patterned surface is etched by vaporization of the reaction products.

In the preferred embodiment, individual films of metals such as molybdenum, tungsten, aluminum, chromium, niobium, tantalum and vanadium are allowed to contact oxygen- or nitrogen-containing atmospheres resulting in surface passivation of the metals. This passivated surface is then exposed to a halogenous atmosphere, such as gaseous $Cl_2$. While in this atmosphere, a directed beam of energy, such as produced by a visible laser, a UV laser, a focused electron source or a focused ion source, is used to write a desired pattern on the thin film surface. In regions contacted by the beam, the passivated surface layer is replaced by a halide. Thus, a molybdenum oxide passivation layer which has been irradiated in a chlorine atmosphere, regions contacted by the beam will react to form molybdenum chlorides driving the oxygen off the surface and into the surrounding atmosphere. The $Cl_2$ atmosphere is then replaced by a halogen-containing etchant such as gaseous $NF_3$. An unfocused laser or other source of undirected thermal energy such as a flood illuminator or radiant heater is used to develop the pattern. In the patterned regions in which halogenation has occurred and the passivating oxide coating removed, the halogenated surface layer is removed by etching and etching of the underlying metal also takes place, thereby producing a patterned, etched metal thin film.

FIG. 1 is a representation of a process by which metal contacts are added to a MOSFET using the method of the present invention. This invention is not intended to be limited to MOSFETs, however. Surface acoustic wave devices, charge coupled devices, superconducting devices, optical devices, optical-electronic devices, and other semiconductor devices are all contemplated by the invention.

Figure 1A:
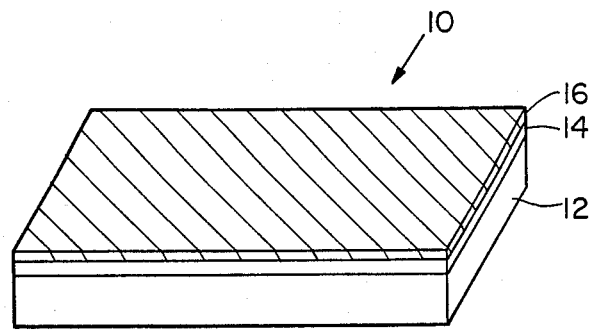
FIGS. 1(a)–1(e) are schematic representations of one embodiment of the present etching process in which an oxide surface on a refractory metal is selectively halogenated in a halogen-containing atmosphere using a focused laser and then etched with an unfocused laser in an atmosphere containing a second halogen to produce a MOSFET.

FIG. 1(a) generally depicts a layered article 10 comprising a doped substrate 12, a metal layer 14, and a surface passivating film 16. The doped substrate 12 used in the MOSFET comprises silicon or gallium arsenide and has both n-type and p-type doped regions. The metal layer 14 shown in this representation is molybdenum which can be formed on the substrate 12 by well known processes such as evaporation. The surface passivating layer 16, comprises a molybdenum oxide or nitride; formed by exposing the metal layered substrate to an atmosphere containing a passivating agent such as oxygen or nitrogen. Preferred passivating agents include $O_2$, $N_2$, $O_3$, $NO_2$, $N_2O$ and $NH_3$.

Figure 1B:
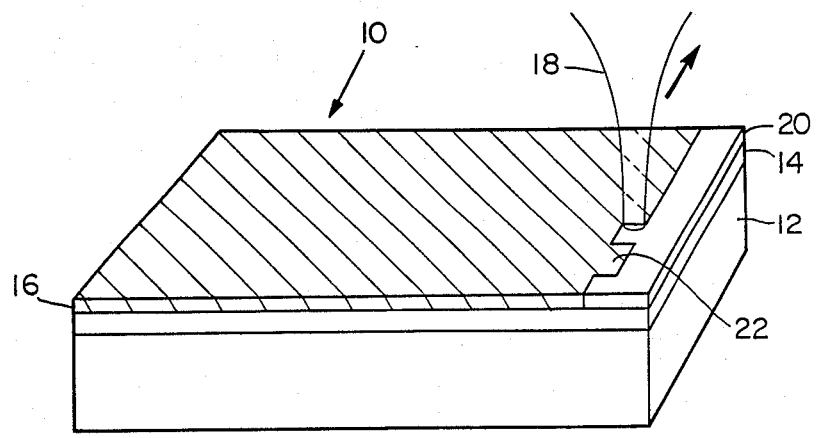

In FIG. 1(b), a focused laser beam 18 is used to pattern the layered article 10. The patterning is performed in an atmosphere containing a halogen such as $Cl_2$. Regions of the surface passivating layer 16 which are irradiated by the laser 18, undergo a reaction in which the oxides or nitrides are replaced by chlorine producing a molybdenum chloride layer 20. As the laser can be turned on and off, it is possible to selectively leave an oxide or nitride layer pattern on the surface of the layered article 10. For example, the region 22 is a section in which the laser was momentarily deenergized, thereby leaving a surface passivating film in that region. The metal 14 and substrate 12 in region 22 are unaffected.

Figure 1C:
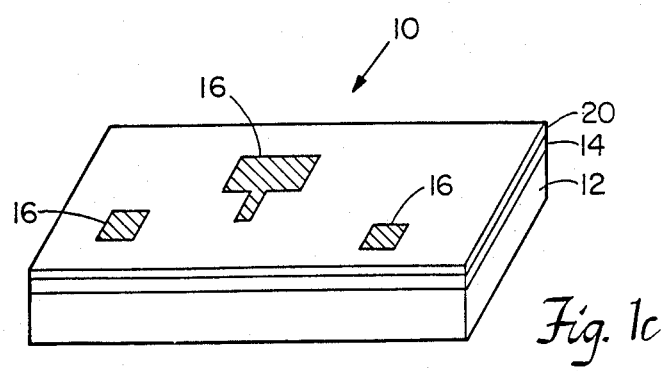

FIG. 1(c) depicts the layered article 10 after being irradiated. The surface comprises molybdenum chlorides 20 in the regions which were irradiated in the chlorine atmosphere and molybdenum oxides or nitrides 16 in the regions which were not irradiated. The metal layer 14 and the substrate 12 remain unaffected.

Figure 1D:
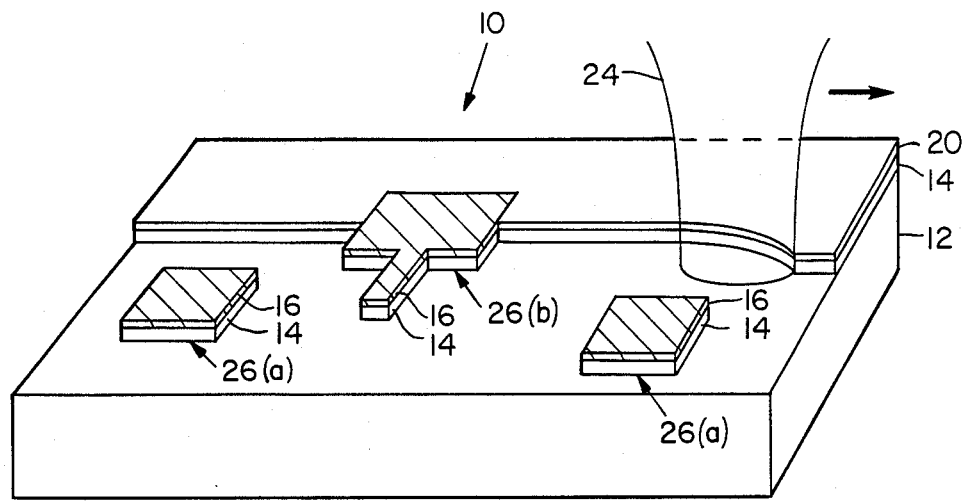

FIG. 1(d) depicts the step of heating the patterned layered article 10 using a broad beam laser 24 to etch the metal layer 14. The broad beam laser 24, is swept over the layered article 10 in an etchant atmosphere such as an atmosphere containing $NF_3$, $HCl$ or $F_2$. In regions having a surface of molybdenum chloride 20, the heat from the laser etches the surface layer 20 and the underlying metal layer 14 via a thermally activated chemical reaction. These regions are etched down to the substrate surface 12. In regions which have oxide or nitride surface passivating layers 16, no etching occurs. Thus, below the surface passivating layers 16, the molybdenum layer 14 remains intact. The combined molybdenum and molybdenum oxide or nitride layers form contacts 26(a) and 26(b) upon the substrate 12.

Figure 1E:
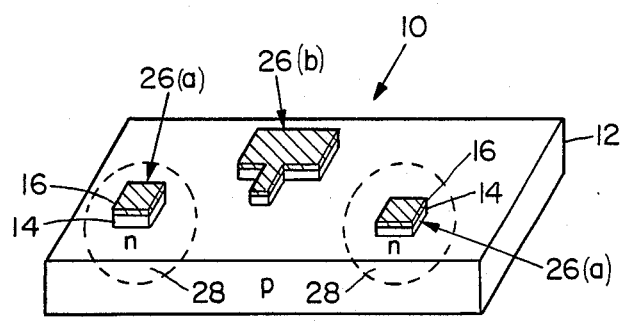

The completed MOSFET is depicted in FIG. 1(e). The layered article 10 has been etched so that only regions which have a passivating surface layer 16 remain upon the substrate 12. These regions comprise a molybdenum layer 14 with a surface passivating layer 16 and form the MOSFET contacts. The regions 26(a) represent contacts for source/drain regions because they are located over n-type doped sections 28 of the substrate 12. The region 26(b) represents a contact for the MOSFET gate region because it is located over a p-type doped section 30 of the substrate 12.

The experimental apparatus consisted of a line-tunable, continuous wave (cw), Ar-ion laser operated at 488 nm and focused between a 1.5 and a 6 $\mu$m spot size. Substrates to be patterned were mounted in a flowing vapor chamber on a computer-controlled translation stage. Films of Mo and W, ranging between about 30 and 100 nm thickness were deposited on substrates of silicon, silicon dioxide, gallium arsenide and germanium using electron beam evaporation or ion beam sputtering. $Cl_2$ was selected as the patterning gas, and $NF_3$ was selected as the etching gas. Both were supplied to the chamber by a mass flow controller at a rate of about 4 sccm. For patterning in a direct writing mode, the stage was translated at a variable rate of between about 0.25 to about 2 mm/s. Fused silica substrates were used to study the reaction mechanisms via optical transmission. A Si photodiode was used to detect temporal evolution of transmitted laser light. Etch rates of both Mo and W films were determined from changes in transmission and from optical micrographs of the irradiated regions.

Figure 2:
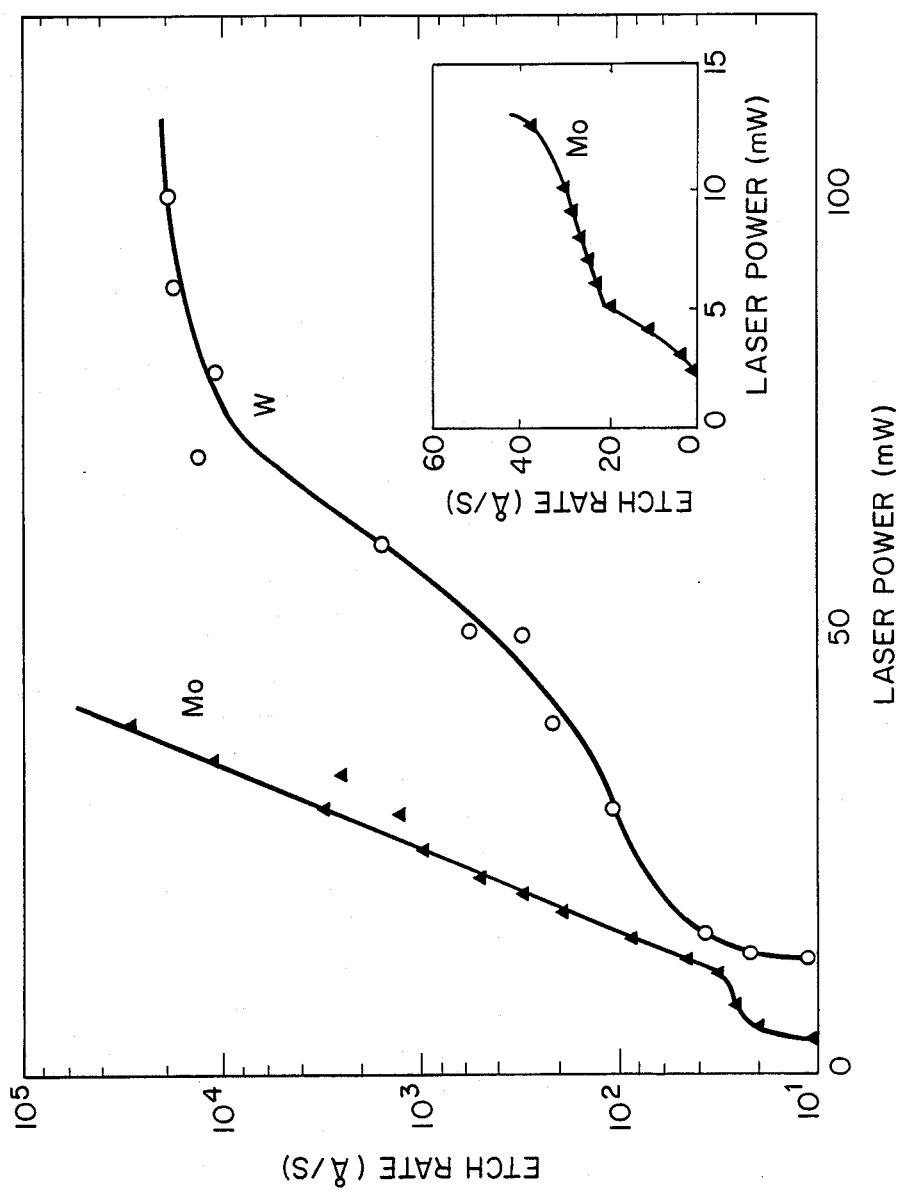
FIG. 2 is a plot in which the etch rate of the present invention is related to laser power for thin films of molybdenum and tungsten.

Time averaged etch rates for both Mo and W are plotted against laser power in FIG. 2. For both Mo and W, the time was for etch through of 30 nm films in 300 Torr $Cl_2$ ambient. The laser wavelength was 488 nm and the spot diameter was 6 $\mu$m. As is evident in FIG. 2, Mo is etched more rapidly than W at all power levels. The etch rates for both metals show a complex power dependence. Both metal reactions show a threshold at which etch rates are nonlinear for low laser power. This domain shows a slight saturation (near about 2-3 nm/s) for each metal. Finally, this dependence is followed by the onset of accelerated reaction.

The inset shows an expanded plot of the figure for Mo in the low power domain. In this domain, etching is entirely suppressed in back or reverse surface irradiation in which the surface is heated identically, but the $Cl_2$ vapor itself not irradiated. Thus, the low power reaction is likely dominated by $Cl_2$ photolysis. Above approximately 2.5 mW of laser power, the rate increases at a rate proportional to approximately where $I^{3/2}$, where I is laser power, and then decreases to a sublinear dependence on I at I greater than about 5 mW. This complex behavior is likely the effect of competing gas phase and surface reactions.

To determine that high power laser induced etching is a combination of pyrolytic and photochemical components, the magnitudes of each component were determined as follows. The etch rate of a 30 nm film on a transparent fused silica substrate was measured in two different configurations. In front irradiation (etch rate $R_1$) the laser passed through the etchant gas before interacting with the surface. In back irradiation (etch rate $R_2$) the laser was incident on the highly attenuating metal film through the transparent substrate without directly interacting with the gas. $R_2$ is therefore a measurement of the pyrolytic rate, while $R_1$ is a pyrolytic rate which may have a photochemical component as well. The ratio $R_1/R_2$ (which is corrected for the small differences in optical coupling between the two geometries) is taken as a measure of the relative importance of photolytic with respect to the pyrolytic reactions.

Figures 3A, 3B:
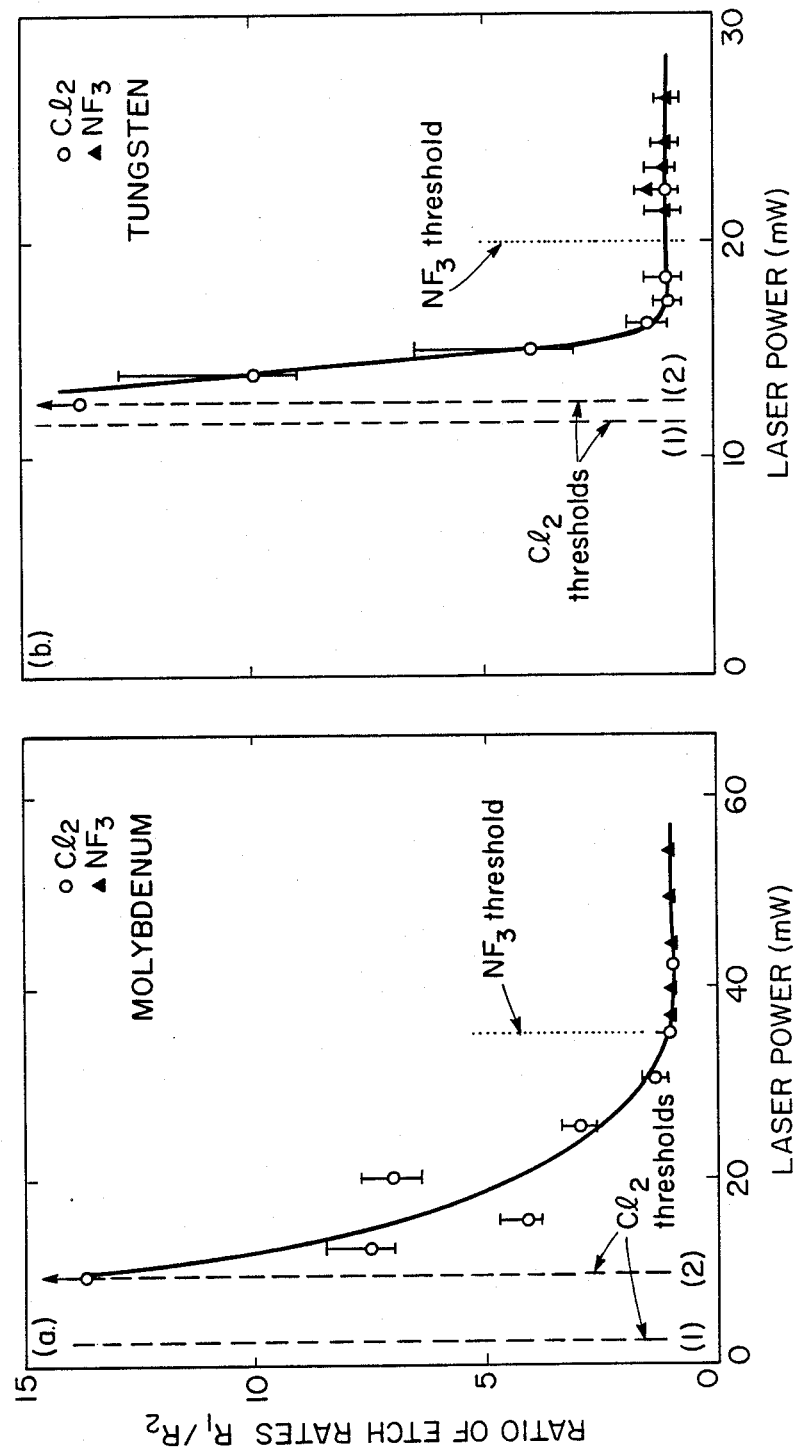
FIGS. 3(a) and 3(b) are plot in which the ratio of front etch rate (consisting of photochemical and pyrolytic components) to rear etch rate (purely pyrolytic) is related to laser power for thin films of molybdenum and tungsten.

FIG. 3(a) plots $R_1/R_2$ against laser power for etching Mo and with $Cl_2$ and $NF_3$. The film thicknesses were 30 nm, the gas pressure was 300 Torr, and the laser parameters were 488 nm wavelength and 6 $\mu$m spot diameter. For $NF_3$, at all power levels greater than the threshold, $I \geq 35$ mW, $R_1/R_2$ is about 1. For $Cl_2$, $R_1/R_2$ is about 1 for $I \geq 30$ mW, and $R_1/R_2$ is greater than 1 for $I \leq 30$ mW. In fact, $R_1/R_2$ approaches infinity in the region near the front-surface threshold, 2.5 mW $\leq I \leq$ 10 mW. These results indicate that etching with $Cl_2$ is increasingly photochemical below I of about 30 mW whereas the etching with $NF_3$ is substantially thermally activated. The results in FIG. 3(b) for W films are qualitatively similar to those for Mo, but with several quantitative differences. The threshold for $NF_3$ etching (the same for front or back illumination) is higher for Mo (35 mW) than for W (20 mW), while the two thresholds for $Cl_2$ etching are lower: 2.5 mW (front) and 10 mW (back) for Mo, compared to 12 mW and 13 mw, respectively, for W.

The most prominent features of these observations can be understood via a simple model following the three-step sequence conventionally postulated for halogen reactions in the absence of laser radiation, i.e., (1) dissociative adsorption of halogen atoms (or halogen-containing radicals), (2) surface diffusion and reaction to form volatile metal halides, and (3) desorption of stable or metastable products. Laser radiation can enter into any of these steps, either by heating the metal surface or by direct photochemistry. As with laser etching of Si and $SiO_2$, efficient photolysis of the etchant gas can certainly accelerate step (1) and will be observed in the overall reaction when this step is rate determining. This is an explanation for the clear photochemical effects observed (FIG. 3) for Mo etching at $I < 30$ mW and for W at $I < 15$ mW.

At $I = 100$ mW and 300 Torr pressure, a chlorine free-radical density of about $3 \times 10^{15}$ cm$^{-3}$ is obtained. This is a very large density of reactive Cl atoms and significantly increases the rate of chlorination of Mo and W at low temperatures. As a point of comparison the total free-radical density in a typical reactive etcher is less than about $3 \times 10^{14}$ cm$^{-3}$. On the other hand, $NF_3$ molecules can be assumed not to interact with the visible laser photons (due to the $NF_3$ absorption cross-section of less than $10^{-23}$ cm$^2$), and the chemical reaction at the surface is largely via thermally dissociated radicals. The photochemical etching of Mo in $Cl_2$ takes place at low laser-induced surface temperatures; the threshold at 2.5 mW power is estimated to correspond to be 160°±75° C. At this temperature the fraction of thermally dissociated $Cl_2$ is estimated to be about $10^{-22}$ compared to about $10^{-5}$ for direct photolysis (I about 2.5 mW) at 300 Torr.

It is reasonable that for the low-power $Cl_2$ reactions, dissociative adsorption [step (1)] can be rate limiting and that the laser photolysis of the vapor can significantly accelerate this reaction. This is not to rule out photochemical enhancements of the other steps. For chlorine etching, the conventional assumption is that the surface reaction forms the chlorides $MoCl_5$ and WCl₆; the relative vapor pressures correlate with the relative etch rates of Mo and W and would be consistent with desorption being rate limiting at high laser powers.

Figure 4A:
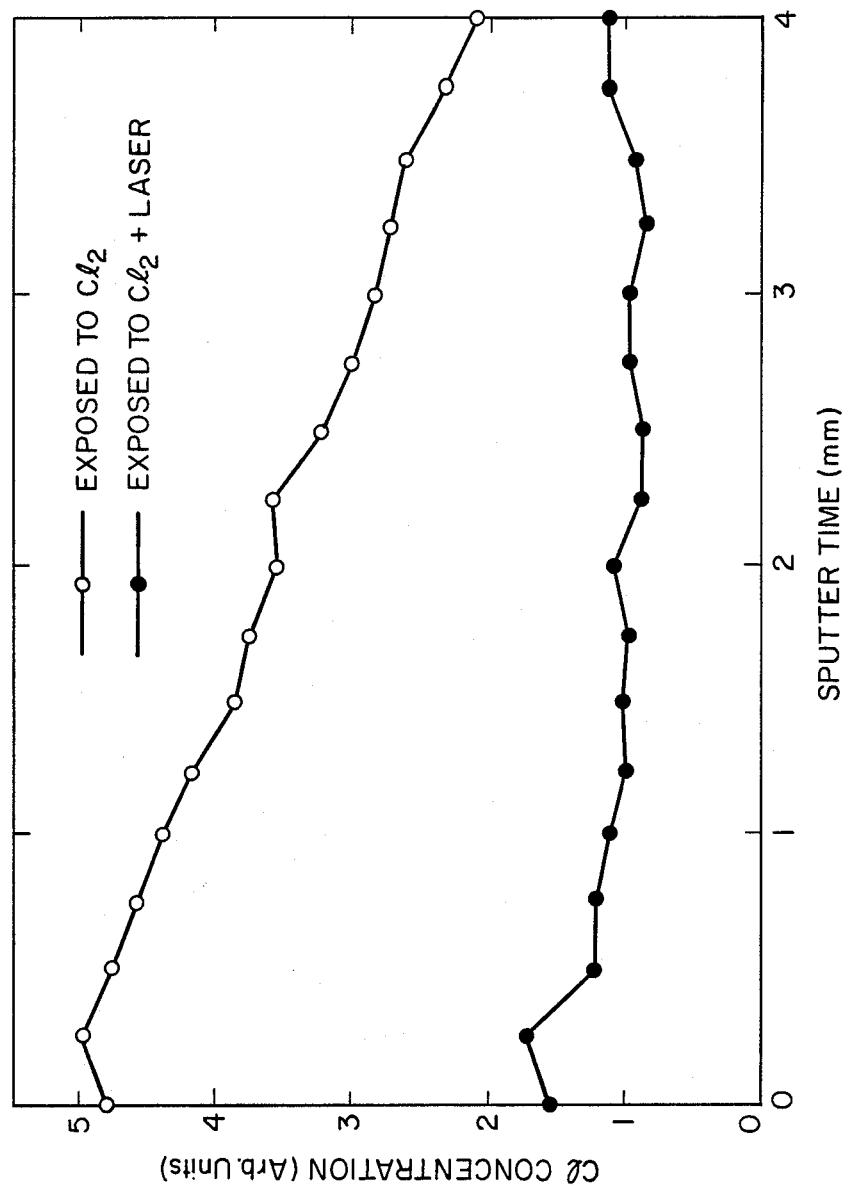
FIGS. 4(a) and 4(b) are plot of the Auger profiles of oxygen and chlorine in molybdenum for molybdenum exposed to chlorine and molybdenum exposed to chlorine and laser radiation.
Figure 4B:
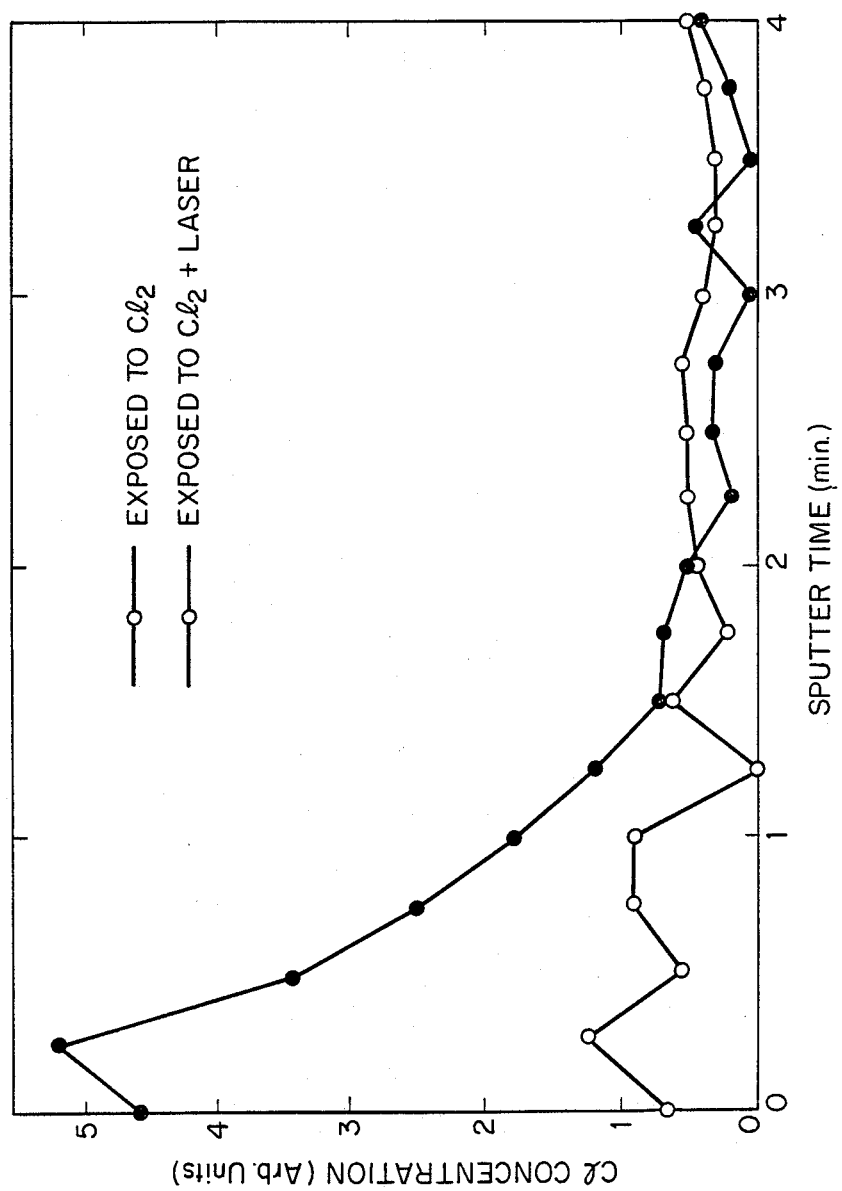

The elemental composition of the surface layer is revealed by Auger electron spectroscopy (AES) of the Mo film as plotted in FIGS. 4(a) and 4(b). Auger depth profiling of a 30-nm thick Mo film shows a large amount (>30%) of oxygen incorporated in the top 4 nm, corresponding to the native oxide of the Mo film. This oxide acts as a barrier towards laser etching of Mo with $NF_3$.

FIG. 4(a) is the Auger profile of oxygen through a molybdenum film. The abscissa represents sputter time and is essentially a measurement of the depth of the measurement. Each minute corresponds to about 10 angstroms, so the value 2 minutes corresponds to a measurement approximately 20A below the surface of the layered article. The ordinate is an arbitrary scale of oxygen concentration and is to be used only for purposes of comparison. In FIG. 4(a) the white circles represent a control which comprises a molybdenum film exposed to air and then placed in an environment of $Cl_2$. As can be seen in the figure, the oxygen content gradually decreases as the measurement moves deeper into the surface. This indicates that a molybdenum oxide film exists on the surface which gradually decreases through the thickness of the molybdenum film. In regions in which the molybdenum has been placed in a chlorine atmosphere and irradiated with a laser, a different effect is seen. In these regions, represented by black circles, the oxygen value is virtually constant at a low noise level. Even at the surface of the irradiated film, the oxygen concentration is less than that found 40A below the surface of films which have not been irradiated.

By comparing FIG. 4(a) with FIG. 4(b), an explanation of what has occurred becomes apparent. In FIG. 4(b) the ordinate is an arbitrary scale of chlorine concentration similar to that of oxygen as in FIG. 4(a). The abscissa is in the same units. Again the control is represented by white circles and represents the chlorine concentration of molybdenum films which have been exposed to air and placed in a chlorine environment without being irradiated. The chlorine concentration is seen to be a low noise value. For regions which have been irradiated after being placed in the chlorine atmosphere, the effects of irradiation can be seen. In these regions, represented by black circles, the concentration of chlorine is seen to be very high, dropping sharply as greater surface depths are studied.

Thus, viewing FIGS. 4(a) and 4(b) together leads to the conclusion that in regions that have been irradiated in the chlorine atmosphere, the oxides have been replaced by chlorides. However, in regions exposed to chlorine but no radiation, an oxide layer, containing only trace amounts of chlorine is present. Thus it is the laser in the presence of the halogen atmosphere, rather than the atmosphere itself which produces a selective halogenation on the surface of the layered article.

Figure 5:
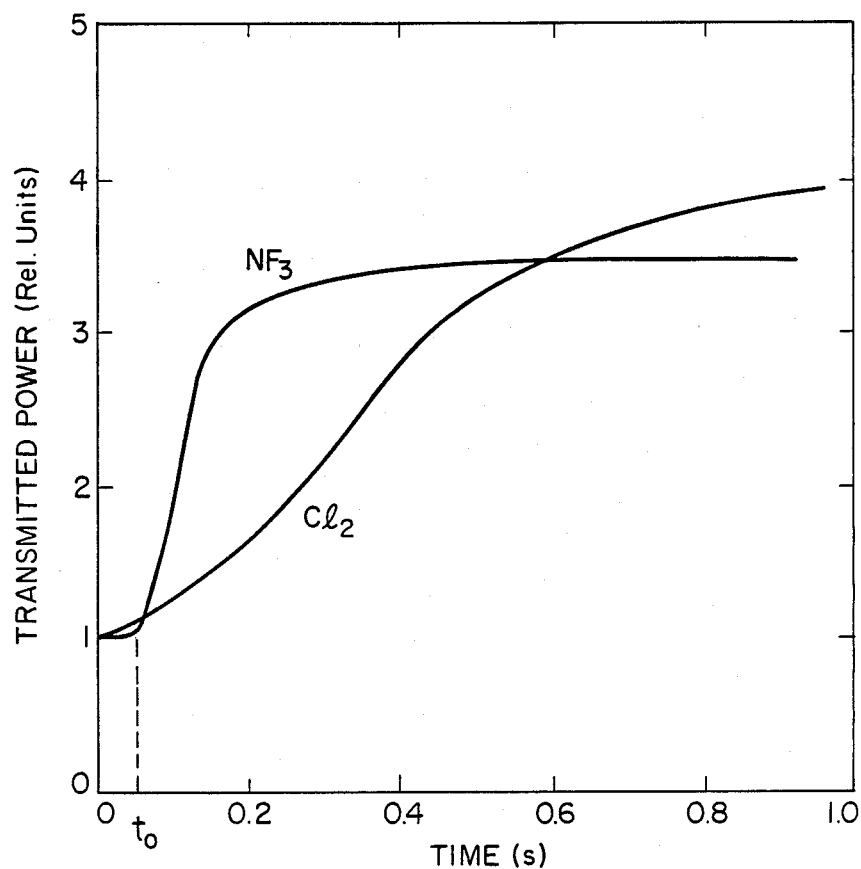
FIG. 5 is a plot of the temporal evolution of the self transmission of a laser through initially 30 nm thick molybdenum film in both $Cl_2$ and $NF_3$ atmospheres.

Transmission curves representative of molybdenum etching are given in FIG. 5 for both the $Cl_2$ and $NF_3$ reactions. Etching with $Cl_2$ is observed to start instantaneously within the resolution of this experiment (~1 ms) as evidenced by the instantaneous rise in transmitted laser power. The point of inflection of the $Cl_2$ curve in FIG. 5 (at $t \approx 0.3$ s) corresponds to etch-through in the center of the laser focus. At $t > 0.3$ s, the transmitted power increases due to further etching over a wide halo, whose size is determined by gas-phase diffusion and recombination kinetics of the Cl atoms, generated photochemically above the surface. The $NF_3$ curve (FIG. 5) exhibits a very different behavior. In particular, there is an induction time, $t_o$ (~50 ms under the experimental conditions of FIG. 5) where no change in optical transmission is observed. The value of $t_o$ depends on laser power and $NF_3$ pressure, and can be varied in the range 10 ms to 10 s. At $t > t_o$, however, the etch rate is faster with $NF_3$ than with $Cl_2$, as seen from the steeper initial slopes in FIG. 5. The saturation level with $NF_3$ is somewhat lower than that with $Cl_2$ because no "halo" is etched, as the etching mechanism is solely pyrolytic with no gas-phase photolysis. The molybdenum layer was initially 30 nm thick. The $Cl_2$ and $NF_3$ were maintained at a pressure of 300 Torr and the laser power was 70 mW on a 6 μm-diameter spot.

In another experiment the conditions were adjusted so that $t_o = 250$ ms, (laser power = 50 mW, $NF_3$ pressure = 300 Torr). A previously untreated area was briefly (20 ms) exposed to 200 Torr $Cl_2$ at 24 mW. The exposure was too short to induce appreciable etching, and no changes in transmission were observed. Following this exposure the $Cl_2$ was pumped out and a 300 Torr $NF_3$ was introduced into the cell. When the laser was turned on (50 mW) the transmission started increasing immediately. The behavior is qualitatively similar to that of $NF_3$ in FIG. 5, except the induction time is reduced to 10 ms. This dramatic reduction in to due to a brief pre-exposure to $Cl_2$, as well as the different behavior of the $NF_3$ and $Cl_2$ curves in FIG. 5, are interpreted as due to a thin layer near the surface of the Mo film, which is resistant towards laser etching with $NF_3$, but is easily removed by laser/$Cl_2$. The induction time, $t_o$, is the time necessary for $NF_3$ to remove this layer. After this the bulk of the Mo is etched rapidly. In contrast, $Cl_2$ etches the top layer rapidly, but the etch rate of the Mo bulk is slower with $Cl_2$ than with $NF_3$.

The existence of an induction time with $NF_3$ is a surface effect. The Auger electron spectroscopy of FIG. 4 indicated a native metal oxide on both metals, typically 4–5 nm thick on our samples. It was speculated that this film acts as a barrier for etching the metal with $NF_3$. In order to test this explanation, metal films were exposed for about 10 min to an oxygen atmosphere after they had been etched with $NF_3$ for a duration slightly shorter than the induction time. When a $NF_3$ etch was attempted again, an induction time equal to the original one was observed. Thus, while the first etching step removed the metal oxide, exposure to oxygen led to its regrowth. It should be noted that no renewed induction period was seen without exposure of the etched surface to oxygen. Also, it was found necessary to irradiate the sample with a low-power laser in vacuum prior to introducing oxygen into the chamber. This additional step is required in order to remove the adsorbed $NF_3$ and prepare the active metal surface sites to oxidation.

As noted above, no induction time was observed when etching with $Cl_2$, indicating that the laser/$Cl_2$ combination is much more effective in etching the metal oxide than laser/$NF_3$. This difference was also demonstrated by first briefly (for about 20 ms) exposing an untreated metal surface to laser/$Cl_2$, followed by irradiation with $NF_3$ ambient. No induction time was observed in the second step, whereas without the first step an induction period of about 250 ms was measured. With $Cl_2$ under comparable conditions the native oxide was removed at least ten times faster than with $NF_3$. Once the oxide is penetrated the etch rate of the metal film itself is much more rapid with $NF_3$ than with $Cl_2$. In this connection it has been found that the mass of adsorbed $Cl_2$ is 10-30 times higher than that of adsorbed $NF_3$ over the pressure range 10-300 Torr. Furthermore, the adsorption is purely a surface effect. No subsurface halogenation was observed with Auger spectroscopy of Mo films exposed to either $Cl_2$ or $NF_3$.

The strong differences in the properties of the $Cl_2$ and $NF_3$ reactions suggest optimal patterning by surface modification. In a first step a 30 nm thick Mo film was exposed to a 200 Torr ambient of flowing $Cl_2$ and irradiated in a pattern with a 488-nm beam focused to a 6.5-$\mu$m diameter. The maximum scan velocity of the instrument, 2 mm/s, was used. The reaction that was induced penetrated the 3-nm thick oxide and passivated the irradiated surface by chlorination, but was insufficient to remove a significant Mo thickness. In a second step the chlorine was flushed from the reactor and the "halogenated" pattern was developed using the fast $NF_3$ thermal reaction. In this demonstration this step is by laser heating in a weakly focused geometry, although alternative conventional heating would be equivalent. The sequence as previously described is shown in FIG. 1. An excellent area-specific selectivity of greater than 10 was achieved for complete through etching of 30-nm thick films in the development step. In a separate experiment a halogenated Mo film was found to retain most of this selectivity after a two day exposure to laboratory air.

Other embodiments of the invention allow the elimination of the laser in the patterning step. In the first of these embodiments, a substrate having a metal film on its surface is exposed to an atmosphere containing a passivating agent such as $O_2$ or $N_2$. Once the passivating layer is present, a photoresist is deposited on the passivating layer, followed by a patterning using conventional photolithographic methods. The surface is then flood illuminated with a green, blue, or UV lamp in the presence of a halogen to halogenate regions from which the photoresist has been removed. For the halogenation step, a standard mercury lamp of 436, 405 or 365 nm can be used. Following the halogenation, the photoresist is removed, and the film is exposed to an etchant, such as $NF_3$, while heated by flood illumination or other heating methods. The halogenated regions and metal regions underlying them are thereby etched while the passivated surfaces remain intact.

In the second of these embodiments, a substrate having a passivated metal surface is prepared as above. The optical image of a prefabricated mask is then projected upon the passivated film while the surface is exposed to an atmosphere containing a halogen. Optical projection systems are well known in the chip manufacturing art. Since they typically operate at 436, 405 or 365 nm, exposure of the substrate surface with a projected mask in a halogen-containing atmosphere results in a patterning of the surface by selective halogenation. As previously described, the patterned surface is then exposed to an etchant, such as $NF_3$, and heated by flood illumination, radiant heat or another method. The halogenated regions and metal regions underlying them are thereby etched, while the passivated surfaces remain intact. This embodiment has an advantage over the previous embodiment in that it does not require the use of a photoresist.

Figure 6:
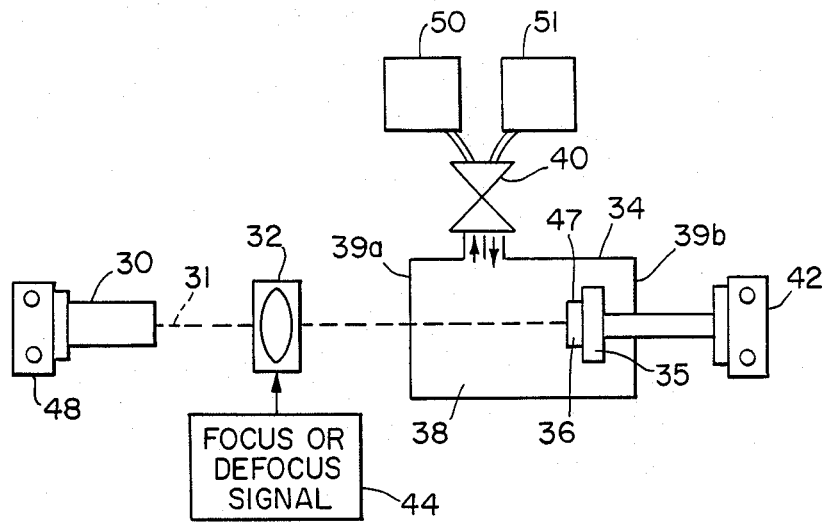
FIG. 6 is a schematic representation of one embodiment of an apparatus for photochemical etching in which both surface halogenation and etching are carried out using a single laser source.

Referring now to FIG. 6, a first particular apparatus for maskless etching on a substrate surface, comprises a directed energy source 30 operated to produce a beam 31 of energy at a desired frequency. In a typical embodiment of the invention, the directed energy is a visible or UV laser beam. The beam is directed through an optical system 32 toward a chamber or cell 34 which has supported therein, by a support assembly or jig 35, a substrate body 36. The illustrated cell or chamber 34 further contains a gaseous mixture 38, supplied and withdrawn through a gas switching valve 40 which is operably connected to a patterning agent source 50 and an etchant source 51. During the patterning step, the patterning agent fills the chamber 34. Once patterning is complete, the switching valve 40 closes the patterning gas source 50. The chamber 34 is flushed with an inert gas to remove any patterning gas, and the switching valve opens the etchant source 51 thereby allowing etchant gas to enter the chamber 34.

In the illustrated embodiment of the invention, the chamber 34 is closed tubular member having a stainless steel body for defining a volume enclosed by end walls 39a, 39b. The illustrated end walls 39a, 39b are selected to be transparent to the directed energy, and in many applications, the substrate body 36 can be selected so that it is also transparent to and passes the energy incident thereon. Under these circumstances, incident radiation can pass through chamber 34, except as attenuated for example, by the patterning or etchant gas, the layer deposited on substrate body 36, and the substrate body itself; and the exiting energy can be monitored by a photodetecting element (not shown).

Figure 7:
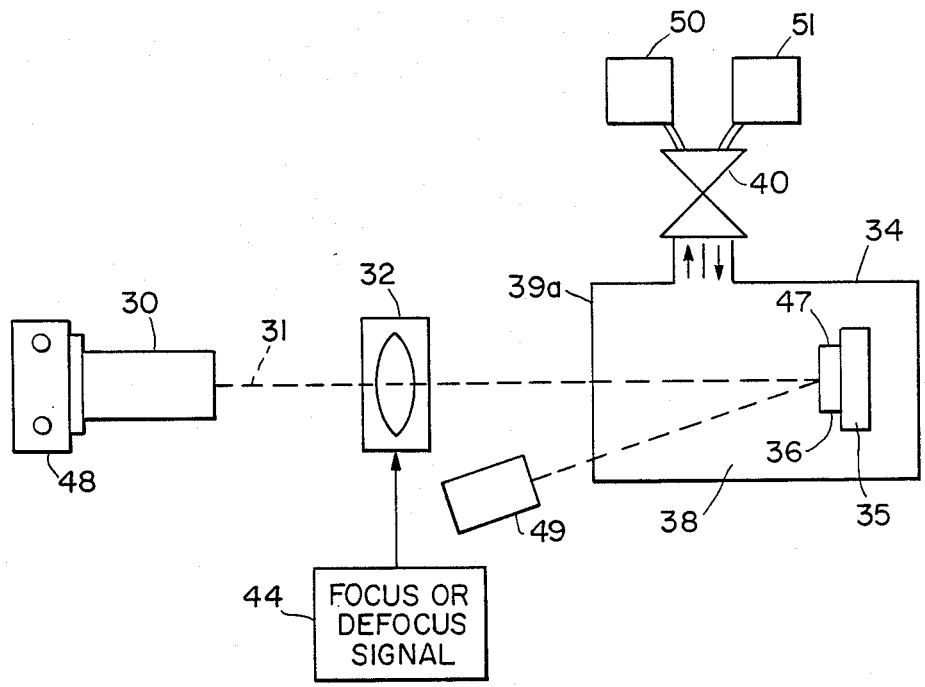
FIG. 7 is a schematic representation of a second embodiment of an apparatus for photochemical etching in which the surface halogenation and etching steps are carried out using separate laser energy sources.

Referring to FIG. 7, in another embodiment of the invention, it is desirable to use a second energy source such as a broad beam laser to heat the substrate surface 36 for the purpose of etching.

The choice of directed energy source depends upon the specific gaseous mixture, and in particular, the decomposable components(s), being employed. The frequency of operation, and in many cases this will dictate the source employed, is chosen to effect photoetching of the decomposable molecules. Decomposition is accomplished when a molecule of the specific components absorbs a photon, from the incident laser beam, of sufficient energy to break one or more of the molecular bonds holding the component molecule together. The decomposition process can also result from a sequence of single photon absorptions.

Figure 8:
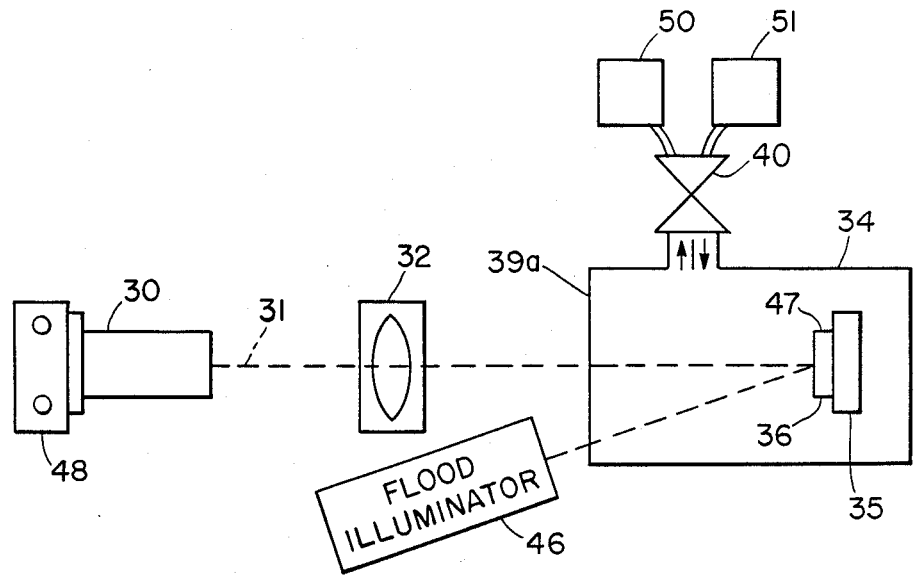
FIG. 8 is a schematic representation of a third embodiment of an apparatus for photochemical etching in which the etching step is carried out using a flood illuminator.

In the illustrated embodiment, a laser source 30 can be focused by optical system 32 adjacent the substrate surface 47 in chamber 34. Illustrated chamber 34 can be a 3.2 centimeter long stainless steel cell having quartz entrance and exit windows. The focusing lens 32 in the illustrated embodiment can have a seven centimeter focal length. In FIG. 6, Controller 44 is used to control the focus of lens 32; in the focused configuration laser 30 is used to pattern the substrate 36 while in the unfocused configuration, laser 30 serves to flood illuminate the cell 34. Alternatively, as shown in FIGS. 7 and 8, a separate (coherent or non-coherent) source 46 can serve to flood illuminate cell 34.

Figure 9:
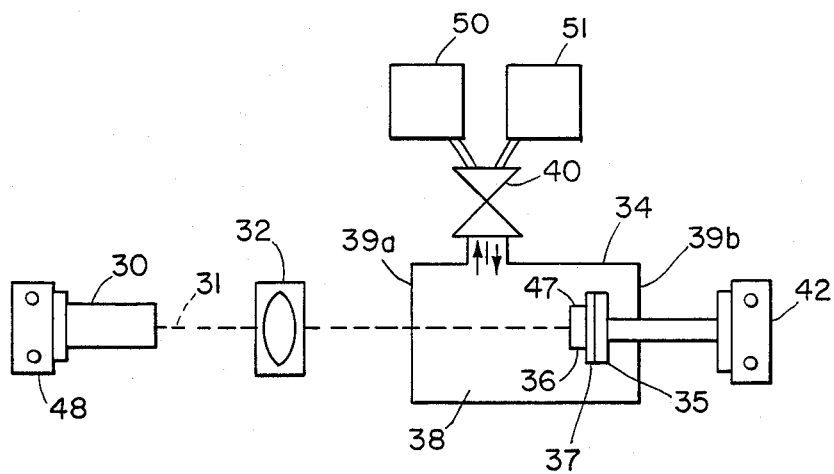
FIG. 9 is a schematic representation of a fourth embodiment of an apparatus for photochemical etching in which the etching step is carried out using a substrate heater.

Referring now to FIG. 9, the unfocused laser 49 or the flood illuminator 46 have been replaced by a substrate heater 37. This heater 37 is in contact with the substrate body 36 and provides heat necessary for etching by conduction rather than by illumination.

Figure 10:
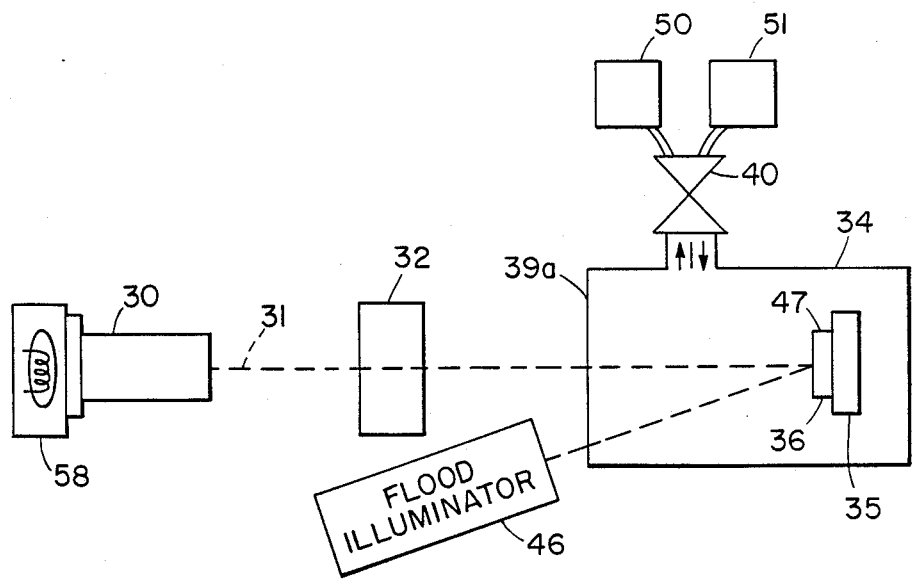
FIG. 10 is a schematic representation of a fifth embodiment of an apparatus for photochemical etching in which the patterning step is carried out by projecting a patterned image onto the surface of a substrate.

FIG. 10 is a representation of a system in which the focused laser 48 has been replaced by a radiant source 58 such as a broad beam laser or conventional lamp. The optical system 32 contains a pattern which is projected upon the surface of the substrate body 36 to produce patterning in this manner. The etching is carried out using a flood illuminator 46 to provide heating.

It should be pointed out that the various configurations described in FIGS. 6–10 are not intended to be limiting. Thus, for example, it is expected that the heater 37 of FIG. 9 could be used in combination with the radiant source 58 and optical system 32 of FIG. 10.

In the illustrated embodiment of FIG. 6, the radiation from the laser source 30 passes through the front entrance window and is incident upon the substrate surface 47. To prevent deposition of etched material on the entrance window, a condition which is not desirable since such deposition reduces the available energy within the chamber, one of several approaches can be employed. First, the front or entrance window of the chamber can be coated with a material or materials having a low sticking coefficient with respect to etched atoms. Thus, the atoms will not condense on the front window. Second, the front window can be heated to encourage reevaporation of the condensing material. Third, a laminar flow of an inert or other nondissociating gas can be directed in front of the window. This effectively provides an insulating gas layer and prevents the photodissociating molecules from making contact with the front window.

Either the laser 30, the optical system 32, or the cell or chamber 34 can be moved to effect relative movement of the focused laser beam relative to the substrate surface 47. In the illustrated embodiment of FIG. 6, a scanning system has a scanning assembly 48 secured to laser 30 for moving laser 30 in a direction normal to the optical axis of optical system 32. As the laser is moved, the focused position of the laser beam adjacent to the surface 47 of substrate 36 translates and the focused position is therefore scanned across the surface of substrate 36, for example, according to a predetermined pattern. Alternatively, the substrate 36 and jig 35 can be moved by a scanning assembly 42.

Equivalents

Those skilled in the art will recognize, or be able to ascertain, using no more than routine experimentation, many equivalents to the specific embodiments of the patterning and etching process described herein. Such equivalents are intended to be encompassed within the following claims.

We claim:

1. A method for maskless patterning of surfaces of metal film coatings on substrates comprising the steps of:
   (a) providing a metal film on a substrate;
   (b) exposing the film to an atmosphere containing a passivating layer upon the exposed surfaces of the metal film;
   (c) exposing the surface passivated structure to an atmosphere containing a halogen;
   (d) patterning the passivated structure by directing a beam of energy toward the passivated structure in the presence of the halogen to selectively form metal halides of said halogen in selected regions of the passivated surface where said beam is directed, and leaving a remaining passivated surface on other regions; and
   (e) exposing the patterned passivated structure to an atmosphere containing an etchant while heating the patterned passivated surface, thereby etching the metal in the pattern while leaving the remaining passivated surface intact.

2. A method of claim 1 in which the metal film is selected from the group consisting of molybdenum, tungsten, aluminum, chromium, niobium, tantalum and vanadium.

3. A method as in claim 1 in which the halogen is $Cl_2$.

4. A method as in claim 1 in which etchant is $NF_3$.

5. A method as in claim 1 in which the passivating agent is selected from the group consisting of fluids containing oxygen and fluids containing nitrogen.

6. A method as in claim 5 wherein the passivating agent is selected from the group consisting of $O_2$, $N_2$, $O_3$, $NO_2$, $N_2O$ and $NH_3$.

7. A method as in claim 1 in which the patterning step includes directing a beam of ultraviolet laser energy onto the passivated surface to define patterned regions.

8. A method as in claim 1 in which the patterning step includes directing a beam of a visible laser onto the passivated surface to define patterned regions.

9. A method as in claim 8 in which the laser is an ion laser.

10. A method as in claim 1 in which the beam of energy is selected from the group consisting of focused ion beams and focused electron beams.

11. A method as in claim 1 in which the etching step includes irradiating the patterned, passivated surface with unfocused, broad beam ultraviolet laser energy.

12. A method as in claim 1 in which the etching step includes irradiating the patterned, passivated surface with unfocused, broad beam energy provided by an ion laser.

13. A method as in claim 1 in which the etching step includes heating the patterned, passivated surface with a radiant heater.

14. A method as in claim 1 in which the etching step includes heating the patterned, passivated surface with a flood illuminator.

15. A method as in claim 1 in which the etching step includes heating the patterned, passivated surface with a thermally conductive heater.

16. A method as in claim 1 in which the substrate is selected from the group consisting of silicon, gallium arsenide, germanium, and silicon dioxide.

17. A method for patterning surfaces of metals comprising the steps of:
   (a) providing a metal;
   (b) exposing the metal to an atmosphere containing a passivating agent to form a surface passivating layer upon the exposed surfaces of the metal;
   (c) exposing the surface passivated structure to a halogen-containing atmosphere;
   (d) patterning the passivated structure by directing a beam source of optical energy toward the passivated structure in the presence of said halogen to selectively form metal halides of said halogen on selected regions of the passivated surface where said beam is directed and leaving a remaining passivated surface on other regions; and
   (e) exposing the patterned passivated structure to an atmosphere containing an etchant while heating the patterned passivated surface, thereby etching the metal in the pattern while leaving the remaining passivated surface intact.

18. A method as in claim 17 in which the passivating agent is selected from the group consisting of fluids containing oxygen and fluids containing nitrogen.

19. A method as in Claim 18 wherein the passivating agent is selected from the group consisting of $O_2$, $N_2$, $O_3$, $NO_2$, $N_2O$ and $NH_3$.

20. A method for maskless patterning of surfaces of refractory metal film coatings on substrates comprising the steps of:
  (a) providing a refractory metal film on a substrate;
  (b) exposing the film to oxygen to form an oxide layer upon the exposed surfaces of the metal film;
  (c) exposing the refractory metal film to an atmosphere comprising gaseous $Cl_2$;
  (d) focusing the beam of an ion laser onto the metal film in the presence of said $Cl_2$ to selectively form refractory metal chlorides in selected regions on the metal film where said laser beam is directed;
  (e) replacing the gaseous $Cl_2$ atmosphere with an atmosphere comprising gaseous $NF_3$; and
  (f) exposing the refractory metal film in the presence of said $NF_3$ to an unfocused, broad ion laser beam to heat the refractory metal film surface and selectively etch portions of the refractory metal film thereby providing an etched, patterned refractory metal film on a substrate.

21. A method as in claim 20 wherein the refractory metal is selected from the group consisting of molybdenum, tungsten, aluminum, chromium, niobium, tantalum and vanadium.

22. A method for patterning of surfaces of metal film coatings on substrates comprising:
  (a) providing a metal film on a substrate;
  (b) exposing the film to an atmosphere containing a passivating agent to form a surface passivating layer upon the exposed surfaces of the surface passivating layer;
  (c) applying a photoresist layer over the surface passivating layer;
  (d) patterning the photoresist;
  (e) exposing the patterned photoresist to an atmosphere containing a halogen;
  (f) patterning the film by illuminating the surface with light having a wavelength between about 350 to about 550 nm in the presence of the halogen to selectively form metal halides of said halogen in selected regions of the metal film where said photoresist has been removed thereby driving out the passivating agent in said selected regions and leaving a remaining passivated surface on other regions;
  (g) removing the photoresist; and
  (h) exposing the patterned metal film to an atmosphere containing an etchant while heating the patterned metal film, thereby etching the metal in the pattern while leaving the remaining passivated surface intact.

23. A method for patterning of surfaces of metal film coatings on substrates comprising:
  (a) providing a metal film on a substrate;
  (b) exposing the film to an atmosphere containing a passivating agent to form a surface passivating layer upon the exposed surfaces of the metal film;
  (c) exposing the surface passivated metal film to an atmosphere containing a halogen;
  (d) patterning the film by projecting the image of a prefabricated mask toward the metal film in the presence of the halogen to selectively form metal halides of said halogen in selected regions of the surface passivating layer where the image is projected thereby driving out the passivating agent in said selected regions; and,
  (e) exposing the patterned metal film to an atmosphere containing an etchant while heating the patterned metal film, thereby etching the metal in the pattern while leaving the remaining passivated surface intact.

24. An apparatus for patterning of surfaces of metal film coatings on a substrate comprising:
  (a) a deposition chamber;
  (b) means for supporting the substrate in the chamber;
  (c) means for providing a patterning gas within the chamber;
  (d) means for providing energy to pattern the substrate surface;
  (e) means for translating the energy on the substrate surface;
  (f) means for replacing the patterning gas within the chamber with an etchant gas; and
  (g) means for heating the substrate in the presence of the etchant gas to thereby etch the surface of the substrate.

25. An apparatus as in claim 24 wherein the means for providing energy to pattern the substrate surface is selected from the group consisting of UV lasers, visible lasers electron beam sources and ion beam sources.

26. An apparatus as in claim 24 wherein the heating means is selected from the group consisting of unfocused lasers, flood illuminators, radiant heaters and thermally conductive heaters.

* * * * *

UNITED STATES PATENT AND TRADEMARK OFFICE
CERTIFICATE OF CORRECTION

PATENT NO. : 4,834,834

DATED : May 30, 1989

INVENTOR(S) : Daniel J. Ehrlich and Mordecai Rothschild

It is certified that error appears in the above—identified patent and that said Letters Patent is hereby corrected as shown below:

Col. 11, line 53, after "passivating" insert ---agent to form a surface passivating---.

Col. 13, line 30, after "the" (second occurrence), delete "surface passivating layer" and insert ---metal film---.

Col. 13, line 41, after "the" delete "metal film" and insert ---surface passivating layer---.

Col. 14, line 43, after "lasers" insert ---,---.

Signed and Sealed this

Thirteenth Day of February, 1990

*Attest:*

JEFFREY M. SAMUELS

*Attesting Officer*         *Acting Commissioner of Patents and Trademarks*